United States Patent
Frohberg et al.

(10) Patent No.: US 7,763,476 B2
(45) Date of Patent: Jul. 27, 2010

(54) TEST STRUCTURE FOR DETERMINING CHARACTERISTICS OF SEMICONDUCTOR ALLOYS IN SOI TRANSISTORS BY X-RAY DIFFRACTION

(75) Inventors: Kai Frohberg, Niederau (DE); Thomas Werner, Reichenberg (DE); Holger Schuehrer, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 682 days.

(21) Appl. No.: 11/672,146

(22) Filed: Feb. 7, 2007

(65) Prior Publication Data

US 2008/0012073 A1    Jan. 17, 2008

(30) Foreign Application Priority Data

Jun. 30, 2006    (DE) .................. 10 2006 030 257

(51) Int. Cl.
  *H01L 21/66*    (2006.01)
  *G01R 31/26*    (2006.01)
  *H01L 31/00*    (2006.01)
(52) U.S. Cl. .................. 438/14; 438/48; 257/E21.521; 257/E21.001
(58) Field of Classification Search ................. 257/347, 257/19, 48, E23.179, E21.521, E21.001; 438/14, 16, 18, 11; 250/336.1, 370.01, 370.09
See application file for complete search history.

(56) References Cited

U.S. PATENT DOCUMENTS

| | | | |
|---|---|---|---|
| 2004/0012075 A1* | 1/2004 | Bedell et al. ................. | 257/616 |
| 2004/0235264 A1 | 11/2004 | Forbes ......................... | 438/429 |
| 2005/0124146 A1* | 6/2005 | Bedell et al. ................. | 438/517 |
| 2005/0202604 A1* | 9/2005 | Cheng et al. ................. | 438/151 |
| 2007/0054465 A1* | 3/2007 | Currie et al. ................. | 438/455 |

OTHER PUBLICATIONS

Communication Regarding German application No. 10 2006 030 257.5-33 Dated Feb. 13, 2007.

* cited by examiner

*Primary Examiner*—Thomas L Dickey
*Assistant Examiner*—Nikolay Yushin
(74) *Attorney, Agent, or Firm*—Williams, Morgan & Amerson, P.C.

(57) ABSTRACT

By providing test features of increased thickness in a test structure for performing an x-ray diffraction measurement for evaluating the crystalline characteristics, such as the contents of germanium, an increased accuracy may be achieved, since the patterned SOI layer may be used as an efficient reference for the required data analysis.

7 Claims, 7 Drawing Sheets

TEST STRUCTURE FOR DETERMINING CHARACTERISTICS OF SEMICONDUCTOR ALLOYS IN SOI TRANSISTORS BY X-RAY DIFFRACTION

BACKGROUND OF THE INVENTION

1. Field of the Invention

Generally, the present disclosure relates to integrated circuits, and, more particularly, to complex circuits formed according to silicon-on-insulator (SOI) architecture on the basis of semiconductor alloys, such as silicon/germanium, for enhancing transistor performance.

2. Description of the Related Art

Complex integrated circuits include a large number of transistors, such as P-channel and N-channel field effect transistors, when a CMOS device is considered. Generally, a plurality of process technologies are currently practiced, wherein, for complex circuitry, such as microprocessors, storage chips, ASICs (application specific ICs) and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

Since the continuous size reduction of the critical dimensions, i.e., the gate length of the transistors, necessitates great efforts for the adaptation and possibly the new development of process techniques, it has been proposed to also enhance device performance of the transistor elements by increasing the charge carrier mobility in the channel region for a given channel length. One efficient technique is based on the concept of modifying the lattice structure in the channel region, for instance by creating tensile or compressive strain, which results in a modified mobility for electrons and holes, respectively. For example, creating tensile strain in the channel region may increase the mobility of electrons, which, in turn, may directly translate into a corresponding increase in the conductivity. On the other hand, compressive strain in the channel region may increase the mobility of holes, thereby providing the potential for enhancing the performance of P-type transistors. Therefore, in some approaches, for instance, a silicon/germanium layer is provided in or below the channel region to create tensile or compressive strain therein. In other strategies, a silicon/germanium material is formed in the drain and source regions in the form of a strained layer, thereby inducing a respective strain in the adjacent channel region. The silicon/germanium alloy may be formed on the basis of epitaxial growth techniques, wherein the respective process parameters may be controlled so as to incorporate a specified amount of germanium into the silicon, which substantially determines the degree of lattice mismatch that may finally be obtained in the respective channel region.

Moreover, with respect to transistor performance, in addition to other advantages, the SOI architecture has been continuously gaining in importance for manufacturing MOS transistors, due to their characteristics of a reduced parasitic capacitance of the PN junctions, thereby allowing higher switching speeds compared to bulk transistors. In SOI transistors, a relatively thin crystalline silicon layer is formed on a buried insulation layer and the drain and source regions are formed within the thin silicon layer. Thus, the semiconductor portion, in which the drain and source regions as well as the channel region are formed, may be dielectrically encapsulated by the buried insulating layer and respective trench isolations, which provide the lateral insulation to neighboring devices. Due to these advantages, the strain engineering is also used in SOI transistor devices, in which the silicon/germanium material may be grown on the basis of the thin upper silicon layer in order to obtain the desired strain characteristics in the respective channel region, thereby significantly contributing to a performance gain of SOI transistors.

Thus, when using strain engineering on the basis of silicon/germanium alloys as described above, it is important to calibrate the epitaxial growth process and also to monitor the process result in order to maintain product reliability and uniformity. For this purpose, well-established techniques may be used, one of which includes x-ray diffraction techniques, in which the response of the crystalline structure of a dedicated portion on a semiconductor device with respect to an incoming x-ray beam is evaluated in order to determine, for instance, the germanium contents of the epitaxial material. Although corresponding techniques may work well for bulk devices, problems may arise for SOI devices, as will be explained with reference to FIGS. 1a-1c in more detail.

Figure 1A:
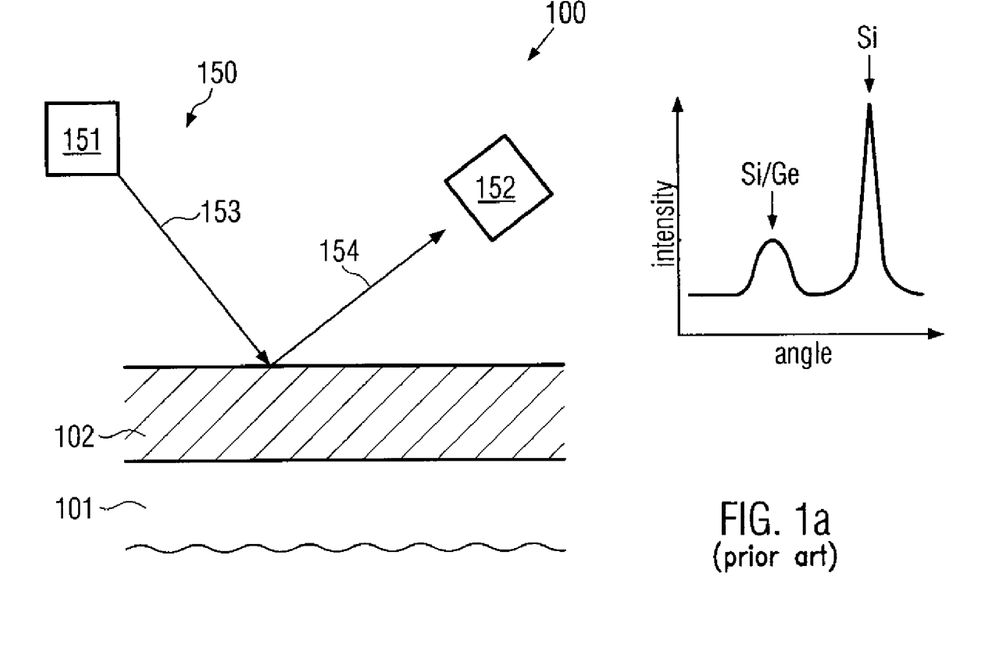
FIGS. 1a-1c schematically illustrate cross-sectional views of a substrate as used for forming semiconductor devices according to different configurations during the evaluation of the germanium contents of an epitaxially formed silicon/germanium alloy according to conventional techniques.

FIG. 1a schematically illustrates a typical test arrangement for determining the contents of germanium in a silicon/germanium layer epitaxially grown on a bulk substrate. A substrate 100 comprises a crystalline base material 101, for example a silicon substrate, on which is formed an epitaxial silicon/germanium layer 102, which may be formed as a strained semiconductor material, when the layer 102 has substantially the same lattice spacing as the crystalline base material 101. In other cases, a significant portion of the layer 102 may represent a relaxed silicon/germanium layer, when, for instance, a corresponding buffer layer (not shown) may be provided between the base material 101 and the layer 102 in order to continuously increase the amount of germanium, thereby also continuously increasing the corresponding lattice spacing, which may finally substantially correspond to the natural lattice spacing of silicon/germanium, which, as previously explained, may depend on the amount of germanium incorporated in the silicon-based material. Furthermore, the layer 102 may be formed on the basis of any well-established epitaxial growth techniques, wherein respective process parameters may also have an influence on the characteristics of the final layer 102.

In order to determine the respective germanium contents of the layer 102, an x-ray diffraction system 150 may be used, which may comprise a radiation source 151 that is configured to provide a substantially mono-energetic x-ray beam 153, which may interact with the device 100. Furthermore, an x-ray detector 152 is provided to receive a scattered x-ray beam 154, wherein the angular relationship between the source 151, the detector 152 and the substrate 101 may be varied so as to detect respective intensity variations depending on the respective set of crystallographic planes responding to the incoming x-ray beam 153. A corresponding measurement result illustrating the intensity variation in relation to the angle of incidence is schematically illustrated on the right-hand side of FIG. 1a, wherein a corresponding curve may also be referred to as a Rocking curve.

It should be appreciated that the x-ray beam 153 has a large penetration depth and thus interacts simultaneously with the layer 102 and also with the base material 101 such that the corresponding intensity spectrum may exhibit the response of a significant portion of the irradiated area of the substrate 100. For instance, an appropriate scan area for the angular range for the angle of incidence may be selected for an appropriately selected wavelength of the beam 153, which may be accomplished on the basis of the well-known Bragg relation. For instance, the intensity curve as shown in FIG. 1a may schematically illustrate a respective response for the reflection of (004) crystal planes on the basis of a wavelength of the incident beam 153 of 1.54 Å, corresponding to the copper Kα line. Due to the significant amount of silicon material in the base layer 101, a prominent peak may be obtained during the angular scan, as is indicated in the spectrum, while a corresponding peak, which is significantly reduced in intensity and may have an increased width compared to the silicon peak, may be obtained for the silicon/germanium layer 102, due to the slightly different lattice spacing and thus a different Bragg angle. Based on the angular difference between the two peaks, the contents of germanium in the layer 102 may be calculated and may therefore be used for calibrating and/or evaluating the corresponding epitaxial growth process. Consequently, for bulk substrates having formed thereon an epitaxially grown silicon/germanium layer, a highly efficient process control may be accomplished on the basis of the respective measurement data.

Figure 1B:
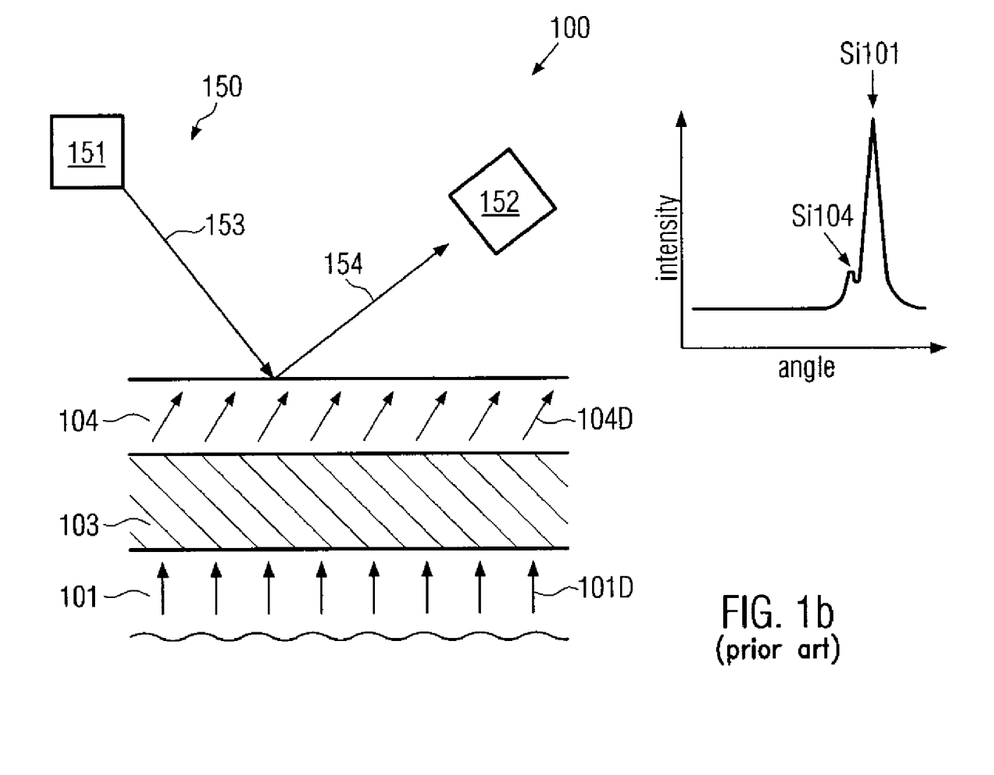

FIG. 1b schematically illustrates the corresponding situation for an SOI substrate 100, which may comprise the base material 101, a buried insulating layer 103, for instance a silicon dioxide layer, and a silicon layer 104 formed on the buried insulating layer 103. The substrate 100 of FIG. 1b, when subjected to the x-ray diffractometric measurement, may also produce a response that is a combination of the layers 103 and 101, wherein the buried insulating layer 103 may only add substantially diffused radiation, thereby contributing to the overall noise of the measurement. The right-hand side of FIG. 1b schematically illustrates a respective response, wherein the peaks of the layer 101 and 104 may exhibit a certain angular difference, depending on the relative crystalline orientation of the layers 104 and 101. For instance, when the substrate 100 is formed by wafer bond techniques, a slight mismatch, for instance a twist and/or a tilt of the respective crystallographic orientations, may be caused, since crystals of different crystalline substrates are combined. Thus, as indicated by the arrows 101D and 104D, a tilt between respective crystallographic planes may result in a corresponding different location (in the angular scan range) of the respective intensity peaks, wherein, as previously explained with the layer 102 in FIG. 1a, the significantly reduced thickness of the material of the layer 104 with respect to the base material 101, of which a significant portion may contribute to the overall response to the incoming x-ray beam, may result in the significantly reduced intensity. Depending on the resolution of the measurement system 150, and depending on the degree of lattice mismatch, the corresponding peak of the layer 104 may be resolved or may not be unambiguously determined.

Figure 1C:
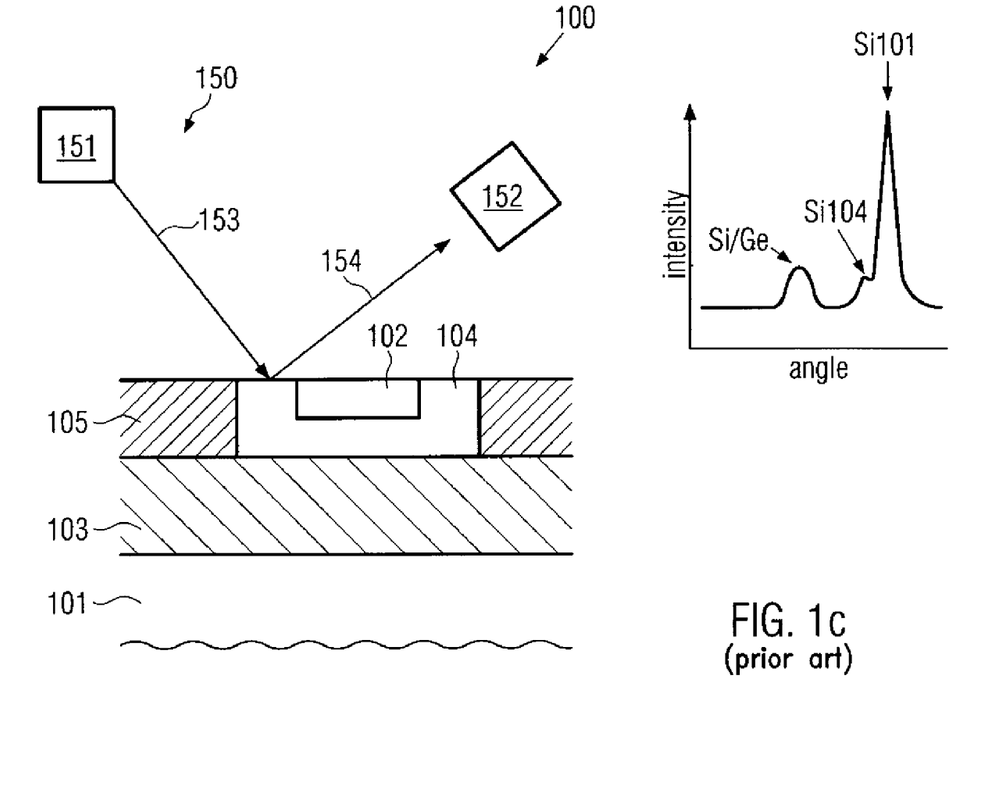

FIG. 1c schematically illustrates the situation when the substrate 100 represents an SOI substrate, whose SOI silicon layer 104 may receive the silicon/germanium alloy 102 so that a patterned structure is formed, which may additionally comprise any non-crystalline areas 105, such as dielectric materials and the like. For instance, the silicon/germanium alloy 102 may be formed as a substantially embedded material that may be grown in respective recesses formed in specific layer portions of the SOI silicon layer 104. In this case, the response of the residue of the SOI layer 104 may be even further reduced, similarly to the response of the material 102, while nevertheless a respective peak of the base material 101 is provided with high intensity due to the high amount of material contributing to the response of the incoming x-ray. The right-hand side of FIG. 1c may schematically illustrate a corresponding response, wherein a recognizable peak for the material 102 may still be obtained, while the respective peak of the silicon layer 104 may no longer be detectable due to the significant background noise. Consequently, in conventional measurement strategies for determining the contents of germanium in patterned SOI substrates on the basis of x-ray diffractometry, the prominent peak of the base material 101 is used for the calculation. As previously explained, however, the corresponding crystalline orientation of the base material 101 may have a specific deviation with respect to the layer 104, while the characteristics of the alloy material 102 are determined by the layer 104 so that the corresponding calculation may provide a highly inaccurate result, which may reduce the performance of a corresponding process to calibrate and/or monitor the respective epitaxial growth process.

In view of the situation described above, there exists a need for determining characteristics of a semiconductor alloy on the basis of x-ray diffractometry while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that may enable the increase of the signal-to-noise ratio of a response to an incoming x-ray beam in a test structure including an SOI architecture, such that a response of a patterned SOI layer may be detectable and thus may be used as a reference for determining one or more crystalline parameters of the semiconductor alloy. Consequently, respective processes for forming semiconductor alloys in patterned SOI substrates may be efficiently controlled on the basis of non-destructive and well-available x-ray measurement techniques. The enhanced responsiveness of a respective test structure may be obtained, in some aspects, by appropriately redesigning a corresponding test structure so as to include semiconductor portions of the SOI layer that extend substantially along the entire depth, thereby providing an increased interaction with the incoming x-ray beam. In other aspects, additionally or alternatively, the lattice mismatch between the crystalline base material and the SOI semiconductor layer may be intentionally increased so that the peak of the base material having the high intensity is well beyond an angular range of interest for estimating the semiconductor alloy.

According to one illustrative embodiment disclosed herein, a semiconductor device comprises a substrate comprising a first SOI region and a second SOI region. Moreover, a plurality of transistors is formed in the first SOI region, which comprise a semiconductor alloy. Moreover, a test structure is formed in the second SOI region, wherein the test structure comprises a plurality of first test features comprised of the semiconductor alloy and a plurality of second test features. The second test features are formed laterally adjacent to the first test features and extend to a buried insulating layer of the second SOI region.

According to another illustrative embodiment disclosed herein, a test structure comprises a crystalline substrate having formed thereon an insulating layer and a semiconductor layer that is formed on the insulating layer. Furthermore, the crystalline substrate and the semiconductor layer have a lattice tilt mismatch of approximately 2 degrees or more. Furthermore, a crystalline region comprises a semiconductor alloy and is embedded in the semiconductor layer.

According to yet another illustrative embodiment disclosed herein, a method comprises forming a semiconductor alloy in a test structure that is formed above a substrate, wherein the substrate comprises an SOI portion having a crystalline base layer, a buried insulating layer and a pre-patterned crystalline semiconductor layer. The method further comprises increasing a signal/noise ratio of a response to a probing x-ray diffractrometry beam by adjusting a ratio of material of the semiconductor layer and the semiconductor alloy in the test structure and/or increasing a lattice mismatch of the crystalline base layer and the semiconductor layer. Finally, the method comprises determining at least one characteristic of the semiconductor alloy using the semiconductor layer within the test structure as a reference.

BRIEF DESCRIPTION OF THE DRAWINGS

The disclosure may be understood by reference to the following description taken in conjunction with the accompanying drawings, in which like reference numerals identify like elements, and in which:

FIG. 2d schematically illustrates a top view of the test structure included in the device of FIG. 2a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for determining crystalline characteristics of a semiconductor alloy, such as the contents of the species in the alloy, a strain of the semiconductor alloy and the like. For this purpose, generally a degraded signal/noise ratio of respective conventional x-ray diffractrometry measurements on patterned SOI substrates may be significantly increased in order to enable the detection of a corresponding intensity peak of the SOI layer so that an appropriate reference measurement point is obtained, on the basis of which the desired crystalline characteristics of the semiconductor alloy may be estimated. Since semiconductor alloys, such as silicon/germanium, silicon/carbon and the like, are frequently formed on patterned SOI structures in order to enhance the respective transistor performance of highly sophisticated CMOS devices, an appropriate control of the respective manufacturing process for forming the semiconductor alloys is of high importance with respect to process uniformity, device reliability and production yield. Consequently, by significantly reducing any inaccuracies with respect to the estimation of crystalline characteristics, which may typically be produced by conventional techniques of patterned SOI substrates, when the response of the semiconductor alloy is compared to the response of the base material, an efficient technique for sophisticated process calibration and control may be established on the basis of the non-destructive x-ray measurement techniques.

With reference to the accompanying drawings, further illustrative embodiments will now be described, in which efficient techniques for increasing the detectability of the response of the patterned SOI layer may be accomplished in order to allow meaningful and statistically relevant estimations with respect to at least the contents of the respective components of the semiconductor alloy under consideration. According to one aspect, the thickness of any SOI layer features after patterning and forming the corresponding semiconductor alloy may be selected such that an increased responsiveness of the SOI features is generated, as will be described in more detail with reference to FIGS. 2a-2e and 3a-3b, while alternatives or additional measures for increasing the signal/noise ratio of x-ray measurements on patterned SOI devices will be described in more detail with reference to FIGS. 4a-4b.

Figure 2A:
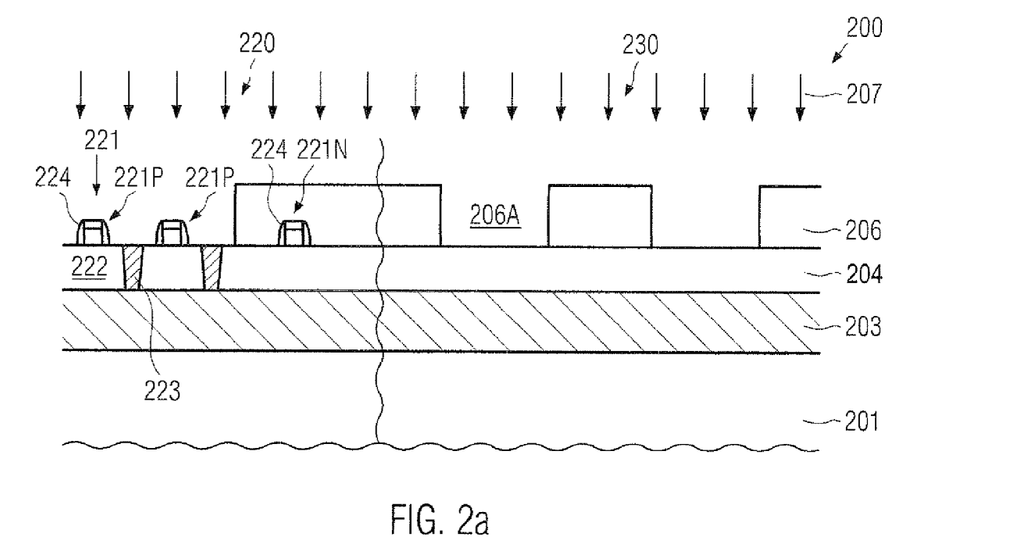
FIGS. 2a-2c schematically illustrate cross-sectional views of a semiconductor device including a test structure having an increased signal/noise ratio with respect to an x-ray diffractrometry measurement according to illustrative embodiments disclosed herein.

FIG. 2a schematically illustrates a semiconductor device 200 comprising a substrate 201, which may represent a silicon base material, such as a silicon substrate or any other substantially crystalline semiconductor substrate. It should be appreciated that presently silicon material is preferably used for highly complex semiconductors, such as microprocessors and the like, in which complex CMOS circuits are used as one important circuit configuration, due to the advantages with respect to cost efficiency, process complexity and the like. As previously explained, strained silicon material may represent a "new type" of semiconductor material that enables a significant gain in performance, that is, for otherwise identical device dimensions, a transistor element may have a significantly enhanced operating speed when an appropriately strained silicon material, possibly in combination with other advantages, such as reduced band gap and the like, may be provided. Consequently, silicon may preferably be used in combination with semiconductor alloys, such as silicon/germanium, in order to impart to specific portions of devices the required crystalline characteristics or to increase the drive current capability. In many promising approaches, the semiconductor alloy may be provided in a highly localized manner, instead of creating a respective semiconductor alloy across the entire substrate, which may be accomplished on the basis of sophisticated epitaxial growth techniques, such as selective epitaxial techniques, implantation and the like, as will be described later on in more detail. Consequently, the respective processes may have to be performed on pre-patterned substrate portions in order to locally form the respective semiconductor alloy, wherein these highly complex processes have to be thoroughly monitored in order to maintain device uniformity. Consequently, in some illustrative embodiments, the semiconductor device 200 may receive an appropriate semiconductor alloy in a respective manufacturing stage wherein device features and a respective test structure may be formed in a common manufacturing sequence in order to provide a high degree of authenticity in evaluating the status of the present process technique. It should be appreciated, however, that the principles disclosed herein may also be applied to the semiconductor device 200 when representing a test substrate, on which may be formed one or more test structures for estimating one or more processes of specific manufacturing stages of an actual semiconductor device.

The device 200 may comprise a substrate 201 having formed thereon a buried insulating layer 203 followed by a semiconductor layer 204, which may represent, in illustrative embodiments, a silicon-based material. Moreover, as previously explained, the device may comprise a first device region 220 and a second device region 230 for forming circuit elements and a test structure therein, respectively. The configuration of the semiconductor device 200 with respect to the layer sequence of the substrate 201, the buried insulating layer 203 and the actual active semiconductor layer 204 may be referred to as a silicon-on-insulator (SOI) device, wherein the device regions 220 and 230 may also be referred to as first and second SOI regions. Moreover, in this manufacturing stage, a plurality of transistors 221 may be provided in the first region 220 in a specific state, while the second region 230 may represent a region for forming therein a test structure for obtaining information on crystalline characteristics of a semiconductor alloy still to be formed in the device 200. According to some efficient process techniques, a silicon-based alloy may be formed within specific device regions in the semiconductor layer 204 in order to locally modify the device performance. For instance, in one promising approach, as previously explained, strained or relaxed semiconductor material may be provided locally within specified transistor areas in order to obtain the desired effects of the semiconductor alloy. For instance, a strained semiconductor material may be provided in drain and source regions of the respective transistor elements, such as some of the transistor elements 221, in order to create a respective strain in the adjacent channel regions. According to one illustrative approach, this may be accomplished by selectively recessing the drain and source regions of specified transistor elements and subsequently performing an epitaxial growth process for depositing a specified amount of semiconductor material within the previously formed recesses. Consequently, in the first device region 220, a plurality of transistors 221P may receive a semiconductor alloy, such as a silicon/germanium alloy, while some transistors 221N may not receive the corresponding semiconductor alloy, or may receive a different type of semiconductor alloy, as will be described later on. For this purpose, an appropriately designed mask layer 206 may be formed, which may be comprised, for instance, of silicon nitride, silicon dioxide or any other appropriate mask material for appropriately patterning the first and second device regions 220, 230 and acting as a growth mask in a subsequent epitaxial growth process. Moreover, in the second device region 230, the mask layer 206 may have respective openings 206A in order to provide a plurality of semiconductor regions which may receive the semiconductor alloy under consideration, while a plurality of device areas are also defined, in which the semiconductor layer 204 is maintained substantially with its entire thickness in order to provide enhanced responsiveness during an x-ray measurement, as will be described later on.

The semiconductor device 200 as shown in FIG. 2a may be formed on the basis of the following processes. The substrate 201 including the buried insulating layer 203 and the semiconductor layer 204, which may also be referred to as an SOI layer, may be formed on the basis of well-established techniques, wherein, in many cases, enhanced wafer bond techniques are used. In this case, two crystalline base substrates are appropriately treated to allow a bonding of respective substrate surfaces to each other, for instance comprising an oxidized portion, which are subsequently bonded to each other in order to form the buried insulating layer 203, wherein one of the substrates may then be separated at a respectively formed cleavage plane, thereby forming the semiconductor layer 204. As previously explained, since crystalline materials of two different substrates may be combined, typically a specific degree of twist and tilt with respect to the crystalline orientations of the base material 201 and the layer 204 may be obtained.

Next, appropriate process steps may be performed in order to define respective active regions 222 in the first device region 220 within the layer 204 on the basis of respective isolation structures 223, such as trench isolations, wherein, in some illustrative embodiments, respective isolation structures may not be formed in the second device region 230, so as to not unduly "waste" precious semiconductor material which may be required for the x-ray measurements. The isolation structures 223 may be formed on the basis of well-established techniques, for instance photolithography, anisotropic etch processes, deposition sequences, planarization and the like. In other illustrative embodiments, when a high degree of authenticity is required with respect to estimating the crystalline characteristics of a semiconductor layer with respect to their effect on actual device features, some or all of the process steps in the first region 220 may also be performed in the second device region 230, as will be described in more detail with reference to FIGS. 3a-3c.

Next, further processes may be performed in order to obtain respective encapsulated gate electrode structures 224, which may include advanced oxidation and/or deposition techniques for forming respective gate insulation layers (not shown), followed by highly sophisticated patterning processes including lithography and sophisticated etch techniques.

Next, the mask layer 206 may be formed, for instance by depositing an appropriate mask material, such as silicon nitride, wherein, if required, an appropriate etch stop layer (not shown) may be provided. As illustrated, in the second device region 230, the mask layer 206 has the openings 206A for defining a plurality of areas for semiconductor alloy features and a plurality of various semiconductor features of increased thickness. Next, the device 200 may be subjected to an appropriately designed etch process 207 for recessing exposed areas of the semiconductor layer 204.

Figure 2B:
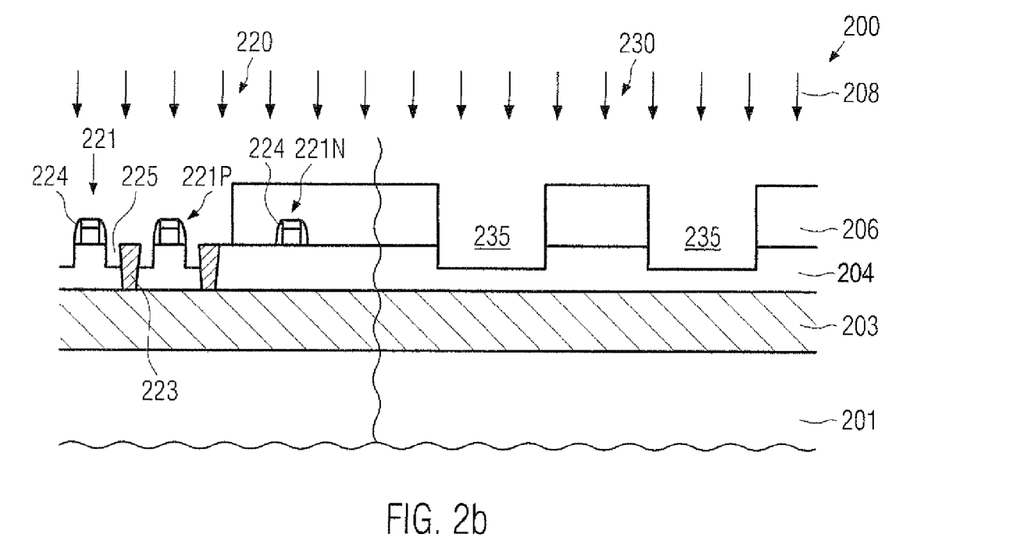

FIG. 2b schematically illustrates the semiconductor device 200 after the end of the etch process 207. Hence, respective recesses 225 are formed adjacent to the exposed transistor elements 221P, and similarly respective openings 235 are formed in the second device region 230, which may substantially define an area of respective test features to be formed by an appropriate semiconductor alloy in a subsequent selective epitaxial growth process 208. In some illustrative embodiments, the growth process 208 may deposit a silicon/germanium alloy on the basis of selective growth techniques in order to provide a strained silicon/germanium in the respective recesses 225, when the transistors 221P represent P-channel transistors. In other cases, the epitaxial growth process 208 may produce a different type of semiconductor alloy, such as silicon/carbon as a strained semiconductor material, when a different type of strain is required in the respective transistors 221 P.

Figure 2C:
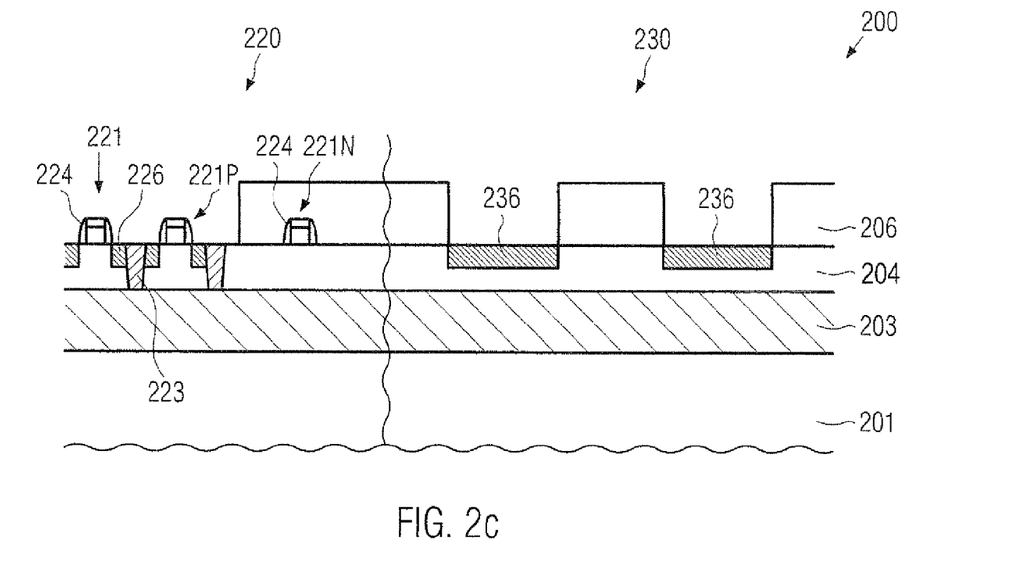

FIG. 2c schematically illustrates the device 200 with respective semiconductor alloy regions 226 in the first device region 220, while corresponding first test features 236 of semiconductor alloy are formed in the second device region 230, wherein the respective "spacings" between the first test features 236 may be considered as second test features 237 representing the semiconductor material of the layer 204, wherein substantially the entire thickness of the layer 204 may be available for interacting with an x-ray beam directed onto the second device region 230 during a test procedure in a later stage. Thereafter, the mask layer 206 may be removed by highly selective etch techniques and, if required, further processing may be continued on the basis of respective manufacturing techniques for completing the transistor devices 221. It should be appreciated that, after the epitaxial growth process 208 and the removal of the mask layer 206, the characteristics of the material of the region 236 and, thus, of the material of the region 226 may be efficiently estimated on the basis of the second device region 230 by performing a corresponding x-ray diffraction measurement as previously described with reference to FIGS. 1a-1c.

Figure 2D:
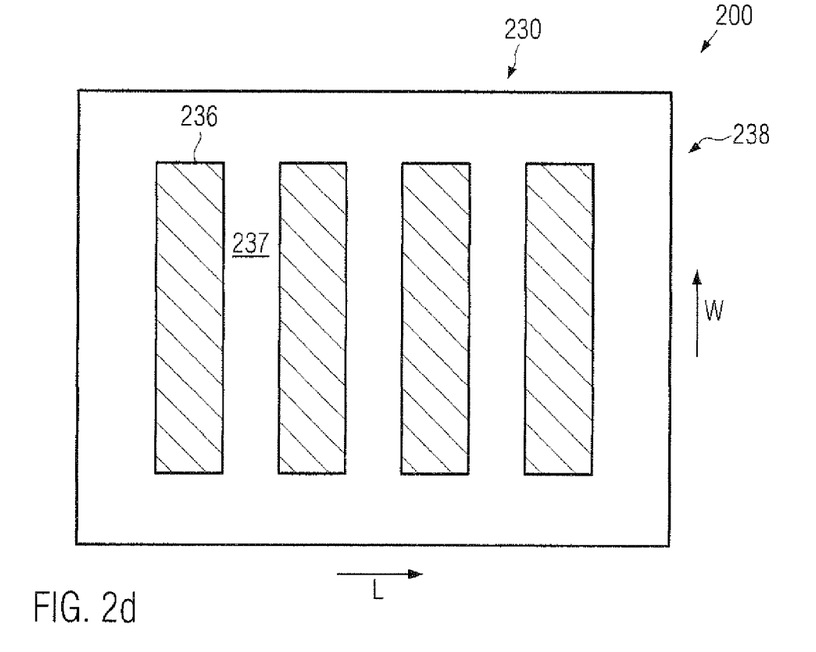

FIG. 2d schematically illustrates a top view of the second device region 230, which comprises the first test features 236 and the second test features 237, which commonly define a test structure 238, in which the second test features 237 provide enhanced responsiveness for an incoming x-ray beam, since a significant portion of the depth, substantially the entire thickness of the initial semiconductor layer 204 in the embodiment shown, may be available for creating a scattered x-ray beam. Consequently, upon performing a respective angular scan with a mono-energetic x-ray beam for obtaining a respective intensity profile of the scattered beam, an increased intensity may be obtained for the material of the layer 204, which may therefore be detected and may be used as a reference with respect to a respective intensity peak generated by the first test features 236. Consequently, the crystalline characteristics, such as composition of the semiconductor alloy in the first test features 236, a degree of strain contained therein and the like, may be estimated with increased accuracy, since the angular difference between the respective intensity peaks may be determined on the basis of a respective response signal having a increased signal/noise ratio with respect to the signal created by the second test features 237. Consequently, the crystalline characteristics of the semiconductor alloy in the first test features 236, which depend on the characteristics of the material of the layer 204, may be determined without being affected by any possible differences in crystalline orientation between the layer 204 and the underlying crystalline base material 201. Moreover, it should be appreciated that, even if the base material 201 and the layer 204 may have substantially the same crystalline configuration, due to a specific manufacturing process for forming the SOI configuration, such as a SIMOX technique, in which the buried insulating layer may be formed by oxygen implantation, an enhanced accuracy may be obtained by providing an increased portion of silicon having experienced the previous process sequences such that the intensity peak caused by the features 237 and the underlying base material 201 may also "include" information regarding crystalline characteristics of the layer 204, which may have resulted during the preceding manufacturing processes.

It should be appreciated that the configuration of the test structure 238 as shown in FIG. 2d is of an illustrative nature only and any other configuration may be selected as long as a plurality of test features 237 are provided which may substantially extend along the entire thickness of the layer 204. For instance, the test structure 238 as shown in FIG. 2d may provide enhanced insensitivity to any alignment inaccuracies during a respective test measurement on the basis of an appropriate x-ray beam, since a translation along the length direction, as indicated by the arrow L, may nevertheless provide a response of at least some of the second features 237, while a translation along the width direction W may not, at least for a certain range, significantly affect the resulting output. In other cases, an increased insensitivity in both directions may be obtained by providing a plurality of first and second test features 236, 237, which may be "interleaved" in both directions L and W, for instance by providing a checkered pattern, or any other appropriate layout.

As previously explained, in some illustrative embodiments, the test structure 238 may be provided on a dedicated substrate, possibly along with other test structures for obtaining respective calibration data and the like in order to appropriately adjust process parameters of the process 208 for forming the semiconductor alloy in the features 236. In other illustrative embodiments, shown with reference to FIGS. 2a-2c, the test structure 238 may be provided on dedicated locations of one or more actual products so that efficient monitoring of the respective process 208 may be accomplished with a high degree of authenticity, wherein, in some illustrative embodiments, respective measurement data may also be used for controlling the process 208. For instance, the respective x-ray measurement data may be available within several minutes and, thus, may be considered as in-line measurement data, which may then be delivered to a respective control system for adjusting process parameters of the epitaxial growth process. For example, efficient advanced process control (APC) systems may be used in order to re-adjust corresponding target values of process parameters in accordance with the x-ray measurement data obtained from the test structure 238. In some illustrative embodiments, the contents of the semiconductor species forming the alloy in the test features 236 may be determined on the basis of respective x-ray measurement data. In other illustrative embodiments, additionally or alternatively, the degree of strain of the material in the test features 236 may be determined, which may also enable the evaluation of the effect of the semiconductor alloy 226 on the respective transistor elements 221P.

Figure 2E:
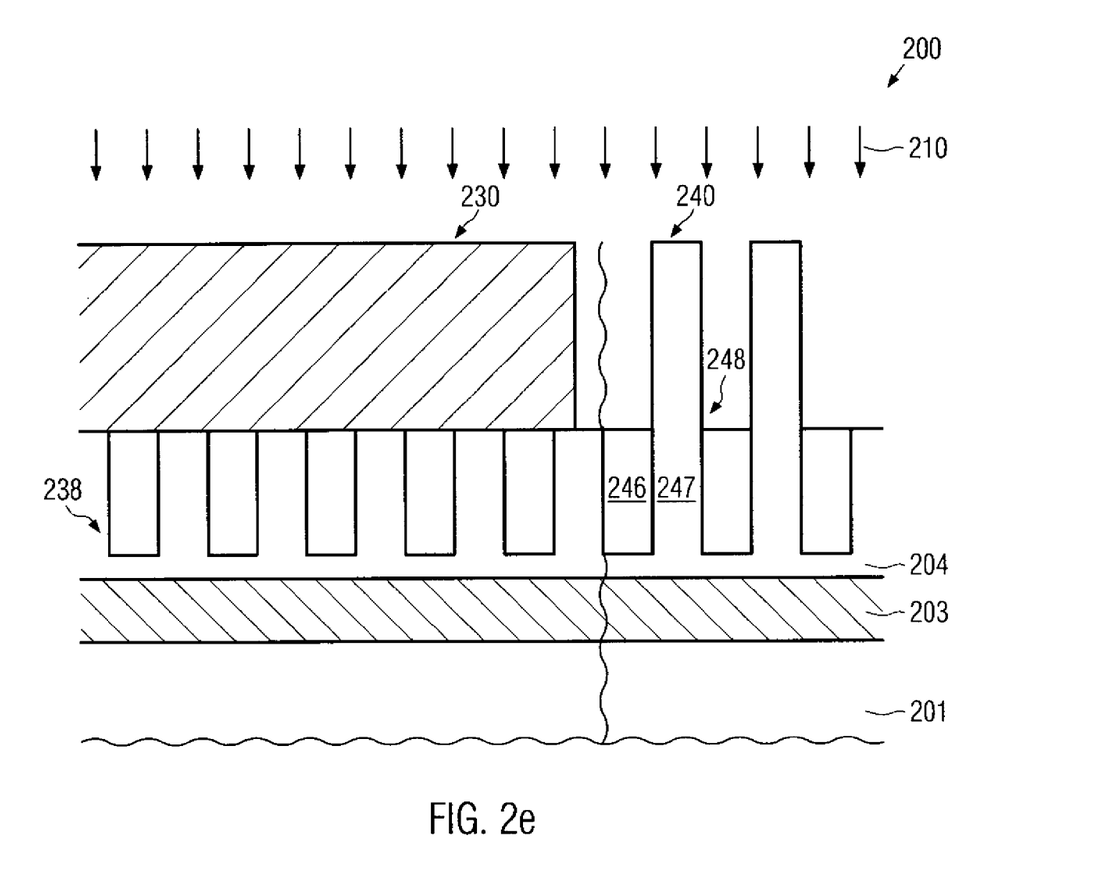
FIG. 2e schematically illustrates the semiconductor device of FIG. 2a when comprising a plurality of test structures, each of which may have different embedded semiconductor alloys.

FIG. 2e schematically illustrates the semiconductor device 200 in accordance with a further illustrative embodiment. Here, a further device region 240 may be provided to define a second test structure 248, which may comprise first test features 246 and second test features 247, wherein the test features 246 may be comprised of a further semiconductor alloy, such as silicon/carbon and the like, while the second test features 247 may represent respective semiconductor portions of the initial layer 204 substantially extending over the entire thickness thereof. As previously explained, in highly advanced applications, two different types of strain-inducing semiconductor alloys may be frequently used to respectively enhance the performance of different types of transistors. Hence, the respective manufacturing processes, although interrelated to each other due to thermal treatments and the like, may significantly differ from each other with respect to type of process, process parameters and the like. Hence, respective calibration and monitoring may be required for the second type of semiconductor alloy. Thus, based on respective process sequences, the first and second test structures 238, 248 may be formed, wherein the test structures 238, 248, in one illustrative embodiment, may be arranged so as to allow a concurrent measurement process, i.e., obtaining the required information during the same x-ray scan. In other illustrative embodiments, when, for instance, the test structures 238, 248 are completed at very different manufacturing stages, they may be arranged so as to be individually accessible by a respective x-ray measurement. In some illustrative embodiments, the second test structure 248 may be formed at least on substantially the same principles as previously described with reference to the test structure 238, i.e., a respective epitaxial growth process may be performed in order to provide semiconductor alloy in the regions 246. In one illustrative embodiment, as shown in FIG. 2e, the second test structure 248 may be formed on the basis of a manufacturing sequence 210, which may comprise appropriate implantation processes accompanied by specifically designed anneal cycles, such as laser-based and flash-based anneal techniques for activating the semiconductor species incorporated by a preceding implantation process. For this purpose, a respective implantation mask 211 may be provided, which may cover the first test structure 238 and possibly any other device areas, in which the introduction of the semiconductor species, such as carbon, may not be desired. Thereafter, any appropriate implantation process, which may include an amorphization implantation followed by the deposition of a respective concentration of, for instance, carbon, may follow with a subsequent highly efficient anneal process. With respect to the configuration of the second test structure 248, the same criteria apply as previously explained with reference to the structure 238. That is, the first and second test features 246, 247 may be arranged in any appropriate manner as long as a plurality of first and second test features are provided so as to provide substantial insensitivity for alignment inaccuracies and to provide a required thickness of the second test features 247, which may extend substantially along the entire thickness of the initial semiconductor layer 204.

Thereafter, the test structure 248 may be subjected to a respective x-ray measurement, wherein a respective measurement of the first test structure 238 may be performed concurrently or at different points of the manufacturing sequences. It should be appreciated that, in some illustrative embodiments, the first and the second test structures 238, 248 may be provided in an "interleaved" manner, wherein the first test features 236, 246 of the first and second test structures may be arranged in a spatially neighboring manner along with neighboring respective first test features 247, 237, thereby allowing concurrent access by an x-ray beam and thus a measurement of the crystallographic characteristics of the first and the second semiconductor alloy of the features 236 and 246.

As previously indicated, in some cases, it may be advantageous to provide a high degree of authenticity with respect to the manufacturing sequence and the corresponding process results obtained for actual circuit elements. In this case, many of the substantial manufacturing processes may also be used in forming the test structure 238, wherein, nevertheless, a high degree of coverage with semiconductor alloy and initial semiconductor material with a desired high thickness may be accomplished.

Figure 3A:
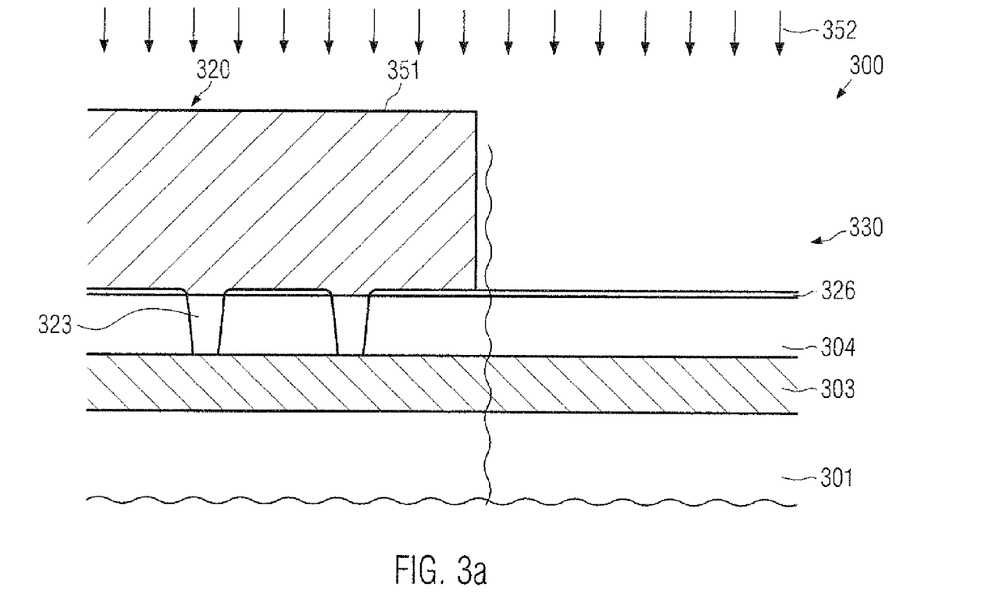
FIGS. 3a-3c schematically illustrate cross-sectional views of a semiconductor device during various manufacturing stages for forming a test structure for x-ray measurements for estimating crystalline characteristics of a semiconductor alloy on the basis of test features having at least one lateral dimension in correspondence to actual device features according to further illustrative embodiments disclosed herein.
Figure 3B:
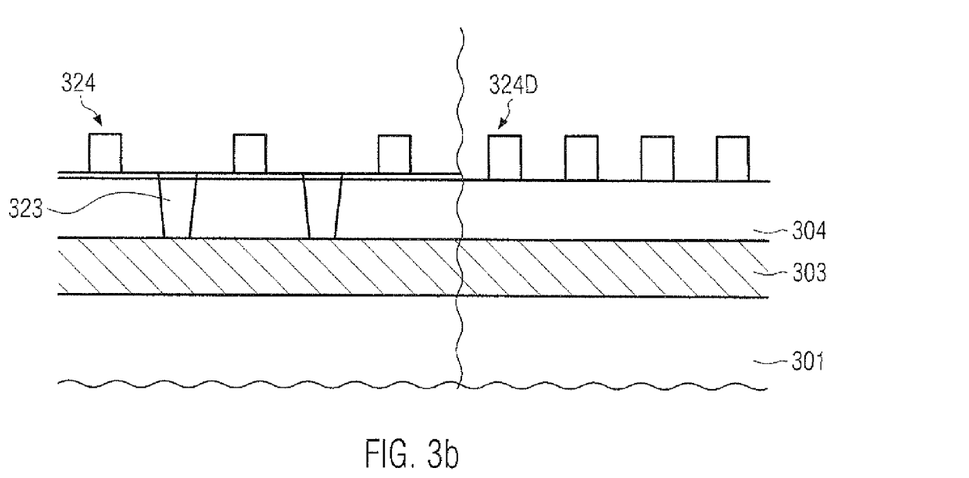
Figure 3C:
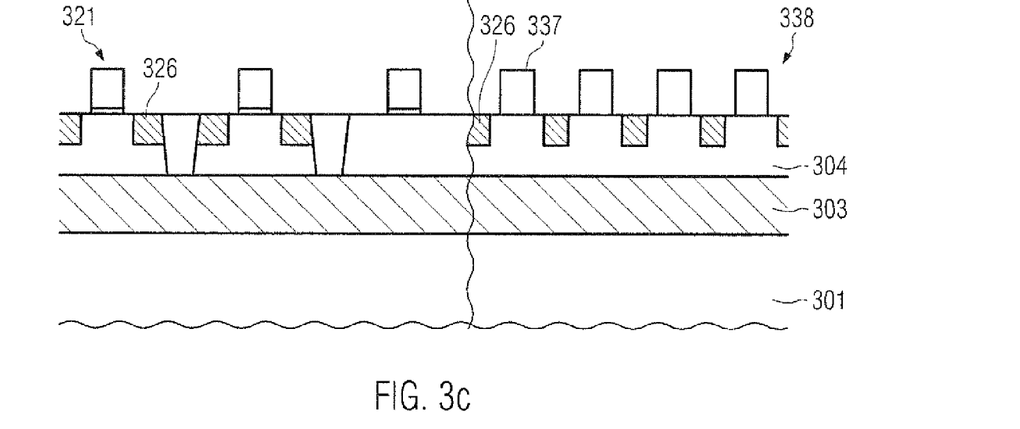

With reference to FIGS. 3a-3c, further illustrative embodiments will now be described, wherein a plurality of dummy features may be formed in the test structures, without unduly adding any additional noise during an x-ray measurement.

FIG. 3a schematically illustrates a cross sectional view of a semiconductor device 300 comprising a first device region 320 and a second device region 330. The device regions 320, 330 may represent SOI regions in the above-defined sense, as is also explained with reference to the device 200. Hence, the device 300 may comprise a crystalline base material 301, a buried insulating layer 303 and an active semiconductor layer 304. With respect to the characteristics of the SOI configuration defined by the components 301, 303 and 304, the same criteria apply as previously explained. Moreover, in the first device region 320 and in the second device region 330, a gate insulation layer 326 may be formed, wherein, in some illustrative embodiments, respective isolation trenches 323 additionally may be formed in accordance with device requirements. Respective isolation trenches may not be formed in the second device region 330, if the amount of semiconductor material consumed by these trenches is considered inappropriate with respect to the signal/noise ratio of an x-ray diffractometry measurement. Moreover, a corresponding mask 351 may be formed to cover the first device region 320 while exposing the second device region 330.

The device 300 as shown in FIG. 3a may be formed on the basis of process techniques corresponding to well established process sequences for forming circuit elements in the device region 320. Moreover, the device 300 may be exposed to an etch ambient 352 for removing the gate insulation layer 326 from the second device region 330 in order to expose the crystalline semiconductor area 304. Appropriate selective etch recipes are well established in the art. Next, a semiconductor material, such as silicon, may be deposited on the basis of well-established recipes, wherein the silicon material may be deposited as a polycrystalline material in the first device region 320, due to the presence of the gate insulation layer 326, while the silicon material in the second device region 330 may be provided as a substantially crystalline material, which may adapt the crystalline characteristics of the underlying semiconductor layer 304. If required, appropriate anneal processes may be performed after the deposition of the silicon material in order to provide a high degree of crystallinity of the material deposited.

FIG. 3b schematically illustrates the semiconductor device 300 in a further advanced manufacturing stage. Here, respective gate electrode structures 324 may be formed in the first device region 320, while respective "dummy" gate electrodes 324D may be formed in the second region 330 on the basis of the substantially crystalline semiconductor material previously formed. To this end, well-established processes including lithography and sophisticated etch techniques may be used in accordance with the device requirements for the gate electrode structures 324, wherein minor differences with respect to the etch behavior and the control of the corresponding etch process in the second device region 330 may not be relevant, since a slightly modified size and shape of the respective gate electrodes 342D may not affect the efficiency of the test structure to be formed in the second device region 330. Thereafter, the further processing may be continued, as is for instance also described with reference to FIG. 2c in order to form the respective semiconductor alloy, such as silicon/germanium, silicon/carbon and the like, by an appropriately designed selective epitaxial growth process, which may be preceded by a corresponding cavity etch process.

FIG. 3c schematically illustrates the semiconductor device 300 after the completion of the above-described process sequence. Hence, corresponding transistor elements 321 may be formed in the first device region 320, which may include, at this manufacturing stage, respective portions of semiconductor alloy in the regions 326, wherein, in the second device region 330, a test structure 338 is formed, which may include features 336 of similar dimensions compared to the actual circuit elements 321, wherein, nevertheless, a high degree of "reference material" may be provided in the form of test features 337, which may include the dummy gate structures 324D and which may have substantially the same crystalline structure as the material of the layer 304. Similarly, the respective first test features 336 may be formed in accordance with dimensions comparable to the regions 326, thereby providing a high degree of authenticity with respect to process-induced crystallographic characteristics of the semiconductor alloy in the region 336, while nevertheless providing a high or even enhanced thickness of the second test features 337. Consequently, the test structure 338 may be used highly efficiently for determining respective crystallographic characteristics on the basis of "reference" test features 337 providing an even increased thickness, while a comparable coverage with semiconductor alloy may be achieved, as is previously discussed with reference to the device 200. Consequently, pattern-induced process variations may be efficiently detected on the basis of the test structure 338. It should be appreciated that the test structure 338 may be combined so as to include at least one further semiconductor alloy, as is also described above with reference to FIG. 2d for the device 200.

As previously indicated, the unwanted high signal intensity of the base material in an SOI configuration may not allow a reliable detection of the corresponding intensity peak of the SOI layer. Thus, according to one illustrative embodiment, the crystalline characteristics of the base material with respect to the SOI layer may be intentionally adjusted so as to obtain a sufficiently high tilt mismatch to avoid a high intensity peak within a desired angular range.

Figure 4A:
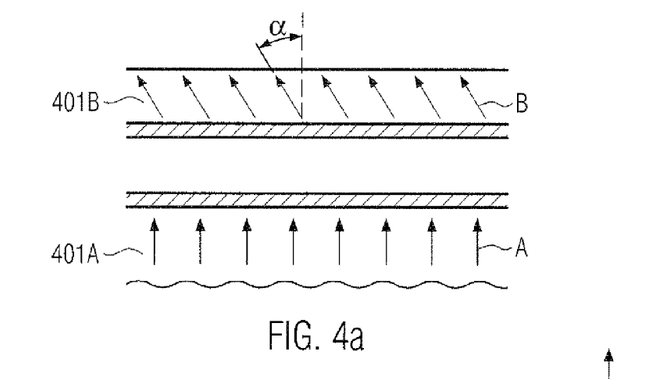
FIGS. 4a-4b schematically illustrate cross-sectional views of a wafer bond technique, in which a lattice mismatch between a crystalline base material and an SOI layer is intentionally increased in order to reduce the influence of the base material for a specified angular scan range, according to further illustrative embodiments disclosed herein.

FIG. 4a schematically illustrates a first substrate 401A and a second substrate 401B, which may have a moderately high tilt $\alpha$ with respect to, for instance, the surface orientation of the base crystalline materials, as indicated by the corresponding arrows A, B. A corresponding tilt may be obtained by forming an oblique surface at one or both of the substrates 401A, 401B so that, after bonding the substrates 401A, 401B, a respective tilt of the crystal orientation may be obtained. In the embodiment illustrated, the substrates 401A, 401B may have formed thereon, if required, a respective insulating material, such as silicon dioxide and the like, in order to commonly define a buried insulating layer after the bonding of the substrates 401A, 401B.

Figure 4B:
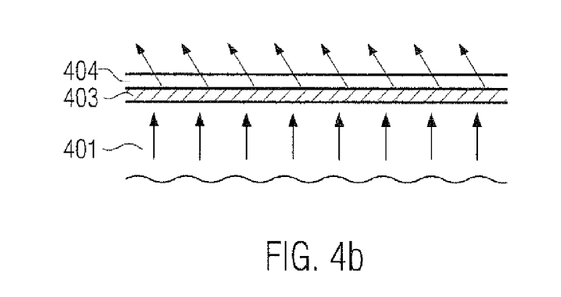

FIG. 4b schematically illustrates the device 400 after bonding the substrates 401A, 401B and after cleaving one of the substrates, such as the substrate 40 1B, thereby providing a semiconductor layer 404 formed on a buried insulating layer 403, which in turn is formed above the base crystalline material 401.

Figure 4C:
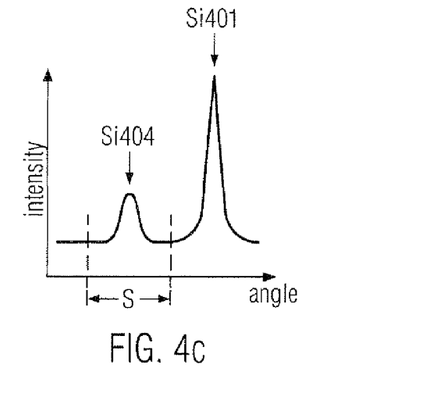
FIG. 4c schematically illustrates a graph showing an increased angular offset of intensity peaks of the crystalline base material and an SOI layer according to the SOI substrate of FIG. 4b.

FIG. 4c schematically illustrates respective measurement data as may be obtained from the device 400, wherein respective intensity peaks S401 and S404 may be spaced in the angular range by at least 2 degrees or even more, so that, for a predefined angular scan range S, as indicated in the drawing, a respective high intensity peak of the crystalline base material 410 may be well outside of the range S. Consequently, when forming respective test structures for patterned SOI configurations on the basis of the device 400, a significantly reduced interference of the base material 401 with respect to the layer 404 may be obtained, thereby enhancing the signal/noise ratio when estimating the characteristics of a semiconductor alloy formed in the layer 404 as is previously described. In some illustrative embodiments, any layout for a respective test structure may be used in the layer 404, while nevertheless providing the potential for obtaining statistically relevant results, whereas, in other illustrative embodiments, the principles described with reference to FIGS. 4a and 4b may be combined with any of the above concepts for forming respective test structures, such as the structures 238, 248, 338, thereby enhancing even more the efficiency of the respective x-ray measurements.

As a result, the subject matter disclosed herein provides efficient techniques for determining crystalline characteristics of semiconductor alloys in patterned SOI configurations, such as silicon/germanium, silicon/carbon and the like, on the basis of efficient test structures, wherein, in some aspects, a thickness of the SOI semiconductor layer may be maintained in significant portions of the test structure in order to produce an increased response to the incoming x-ray beam. Consequently, a respective intensity peak may be detected and may, therefore, be more efficiently used for estimating the crystalline characteristics of the semiconductor alloy. Hereby, a high degree of flexibility in creating a respective test structure layout may be achieved so as to allow a high degree of authenticity with actual manufacturing processes. Consequently, the calibration and monitoring of respective processes for creating semiconductor alloys in patterned SOI structures, such as selective epitaxial growth techniques, standard epitaxial growth techniques, implantation-based processes and the like, may be highly efficiently accomplished, wherein, due to the non-destructive and rapid measurement process, respective in-line process data may be created to enhance even further the control of the respective manufacturing processes. Moreover, a plurality of semiconductor alloys may be evaluated on the basis of separate test structures or combined test structures, wherein the initial layer thickness of the SOI layer may be maintained in the respective semiconductor "reference" test features. In other aspects, the signal/noise ratio of respective x-ray measurements may, additionally or alternatively, be increased by intentionally modifying the lattice mismatch between the crystalline base material and the SOI layer in order to remove a corresponding high intensity peak from an angular range of interest.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate comprising a silicon-on-insulator (SOI) portion having a crystalline base layer, a buried insulator layer, and a crystalline semiconductor layer;
   forming a test structure on said substrate, said test structure including a semiconductor alloy embedded in said crystalline semiconductor layer;
   increasing a signal/noise ratio of a response to a probing x-ray diffractometry beam by at least one of adjusting a ratio of material of said crystalline semiconductor layer and said semiconductor alloy in said test structure or increasing a lattice mismatch of said crystalline base layer in said crystalline semiconductor layer; and
   determining at least one characteristic of said semiconductor alloy using said crystalline semiconductor layer within said test structure as a reference.

2. The method of claim 1, wherein said signal/noise ratio is increased by adjusting a ratio of material of said crystalline semiconductor layer and said semiconductor alloy in said test structure by providing a plurality of regions of said semiconductor alloy.

3. The method of claim 2, wherein said plurality of regions is provided to have at least one lateral device dimension that corresponds to a design dimension of a transistor element.

4. The method of claim 3, wherein providing said plurality of regions comprises forming said plurality of regions in said test structure and forming a plurality of transistor elements in a common manufacturing process.

5. The method of claim 1, further comprising forming said SOI portion by a substrate bond process and adjusting a lattice mismatch between a first substrate comprising said crystalline base layer and a second substrate comprising said crystalline semiconductor layer.

6. The method of claim 1, wherein forming said semiconductor alloy comprises performing an epitaxial growth process.

7. The method of claim 1, wherein forming said semiconductor alloy comprises performing an implantation process.

* * * * *